United States Patent
Yang (10) Patent No.: US 9,438,190 B1
(45) Date of Patent: Sep. 6, 2016

(54) AMPLIFICATION CIRCUIT ADJUSTING DUTY CYCLE OF OUTPUT SIGNAL AND RECEIVER INCLUDING THE SAME

(71) Applicant: SK hynix Inc., Icheon-si Gyeonggi-do (KR)

(72) Inventor: Jae Mo Yang, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/146,961

(22) Filed: May 5, 2016

Related U.S. Application Data (63) Continuation-in-part of application No. 14/458,386, filed on Aug. 13, 2014, now Pat. No. 9,362,867.

(30) Foreign Application Priority Data

May 8, 2014 (KR) .................. 10-2014-0054926

(51) Int. Cl.
   *H03F 3/45* (2006.01)
   *H03F 1/02* (2006.01)
   *H03F 1/30* (2006.01)
   *H04B 1/16* (2006.01)

(52) U.S. Cl.
   CPC .......... *H03F 3/45183* (2013.01); *H03F 1/301* (2013.01); *H04B 1/16* (2013.01); *H03F 2200/351* (2013.01); *H03F 2200/375* (2013.01)

(58) Field of Classification Search
   CPC ................................... H03F 3/45; H03F 1/02
   USPC ........................................................ 330/253, 9
   See application file for complete search history.

(56) References Cited

U.S. PATENT DOCUMENTS

| | | | | |
|---|---|---|---|---|
| 6,642,631 B1* | 11/2003 | Clavette | .................. | H02J 1/102 307/52 |
| 8,237,509 B2* | 8/2012 | Kim | ........................ | H03F 1/223 330/124 R |
| 2002/0140477 A1* | 10/2002 | Zhou | .................... | H03K 5/1565 327/175 |
| 2005/0134220 A1* | 6/2005 | Brohlin | ................. | H02J 7/0072 320/128 |
| 2008/0049478 A1* | 2/2008 | Wong | ................... | H02M 3/156 363/132 |
| 2008/0094861 A1* | 4/2008 | Wang | ................... | H02M 3/156 363/21.11 |
| 2012/0074987 A1* | 3/2012 | Piepenstock | ... | H03K 19/018528 327/108 |
| 2012/0161728 A1* | 6/2012 | Chen | .................. | H02M 3/1563 323/271 |

* cited by examiner

*Primary Examiner* — Patricia T Nguyen
(74) *Attorney, Agent, or Firm* — William Park & Associates Ltd.

(57) ABSTRACT

A receiver includes a first stage buffer, a second stage buffer and a third stage buffer. The first stage buffer includes an input portion electrically coupled to a first voltage node, and configured to change a voltage level of an output node in response to an input signal, first and second load portions electrically coupled between a second voltage node and the output node, and electrically coupled to each other and a duty cycle adjustment portion electrically coupled between the first and second load portions, and configured to provide a correction current to the output node through the first load portion.

18 Claims, 10 Drawing Sheets

AMPLIFICATION CIRCUIT ADJUSTING DUTY CYCLE OF OUTPUT SIGNAL AND RECEIVER INCLUDING THE SAME

CROSS-REFERENCES TO RELATED APPLICATION

The application is a continuation-in-part of the U.S. patent application Ser. No. 14/458,386 filed on Aug. 13, 2014 and titled "AMPLIFICATION CIRCUIT ADJUSTING DUTY CYCLE OF OUTPUT SIGNAL", which is incorporated herein by reference in its entirety.

BACKGROUND

1. Technical Field

Embodiments of the present invention generally relate to a semiconductor apparatus, and more particularly, to an amplification circuit capable of buffering or amplifying an input signal to output an output signal and a receiver including the same.

2. Related Art

In an electronic system in which one device (e.g., master device) controls the other devices (e.g., slave device), the master device sends a control signal and data to the slave device through a plurality of buses, and the slave device sends data to the master device through a plurality of buses.

As described above, the master device and the slave device operate in response to signals transmitted from the other device. In general, the master device includes a reception circuit for receiving a signal transmitted from the slave device, and the slave device includes a reception circuit for receiving a signal transmitted from the master device.

The reception circuit may include an amplification circuit capable of buffering and/or amplifying the transmitted signal. The reception circuit may amplify an input signal, which is the signal transmitted from the other device, and generate an output signal, which may be transferred to an internal circuit of the device receiving the input signal.

The output signal being generated from the input signal at amplification circuit must be in an allowable range so that the control signals and data can, without error, be transferred between the master device and the slave device. However, various factors such as process variation and voltage variation may cause errors.

SUMMARY

In an embodiment, a receiver may include a first stage buffer configured to amplify an input signal, a second stage buffer configured to amplify an output signal of the first stage buffer and a third stage buffer configured to amplify an output signal of the second stage buffer, wherein the first stage buffer includes an input portion electrically coupled to a first voltage node, and configured to change a voltage level of an output node in response to the input signal, first and second load portions electrically coupled between a second voltage node and the output node, and electrically coupled to each other and a duty cycle adjustment portion electrically coupled between the first and second load portions, and configured to provide a correction current to the output node through the first load portion.

In an embodiment, a receiver may include a first stage buffer configured to amplify an input signal, a second stage buffer configured to amplify an output signal of the first stage buffer and a third stage buffer configured to amplify an output signal of the second stage buffer, wherein the second stage buffer includes an input portion electrically coupled to a first voltage node, and configured to change voltage levels of output nodes in response to the output signal of the first stage buffer, first and second load portions electrically coupled between a second voltage node and the output nodes, and electrically coupled to each other and a duty cycle adjustment portion electrically coupled between the first and second load portions, and configured to provide correction currents to the output nodes through the first load portion.

In an embodiment, a receiver may include a first stage buffer configured to amplify an input signal, a second stage buffer configured to amplify an output signal of the first stage buffer and a third stage buffer configured to amplify an output signal of the second stage buffer, wherein the third stage buffer includes a first amplifier having a first input portion electrically coupled to a second voltage node, and configured to generate a first output in response to the output signal of the second stage buffer, a first current mirror configured to provide an amplified current to the first input portion and first and second load portions serially coupled between a first voltage node and the first current mirror, a second amplifier having a second input portion electrically coupled to a second voltage node, and configured to generate a second output in response to the output signal of the second stage buffer, a second current mirror configured to provide an amplified current to the second input portion and third and fourth load portions serially coupled between the first voltage node and the second current mirror and a duty cycle adjustment portion electrically coupled between the first and second load portions and the third and fourth load portions.

BRIEF DESCRIPTION OF THE DRAWINGS

Features, aspects and embodiments are described in conjunction with the attached drawings, in which.

DETAILED DESCRIPTION

Figure 1:
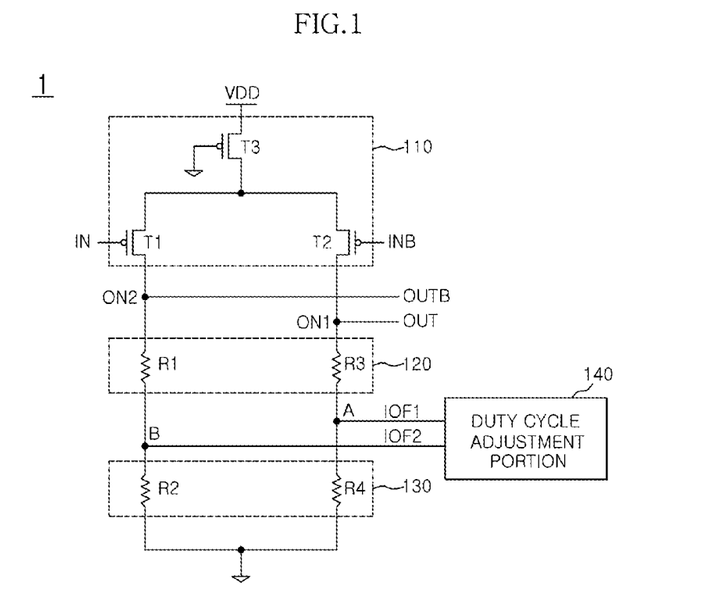
FIG. 1 is a circuit diagram illustrating an amplification circuit in accordance with an embodiment of the present invention.

Referring to FIG. 1, an amplification circuit 1 in accordance with an embodiment of the present invention may include an input portion 110, a first load portion 120, a second load portion 130, and a duty cycle adjustment portion 140. The amplification circuit 1 may receive input signals IN and INB, and generate output signals OUT and OUTB in response to the input signals IN and INB. For example, the input portion 110 may receive the input signals IN and INB, and change voltage levels of output nodes ON1 and ON2 in response to the input signals IN and INB. Referring to FIG. 1, the input portion 110 may be electrically coupled to a first voltage node, which is a node where the amplification circuit 1 receives a power supply voltage VDD, and may change voltage levels of output nodes ON1 and ON2 by adjusting amounts of currents flowing to the output nodes ON1 and ON2 according to the input signals IN and INB. The output signals OUT and OUTB may be generated from the output nodes ON1 and ON2. For example, the levels of output signals OUT and OUTB are voltage levels of the output nodes ON1 and ON2.

The first load portion 120 and the second load portion 130 may be electrically coupled to each other through a plurality of nodes A and B. In an embodiment of the present invention, the first load portion 120 and the second load portion 130 may be electrically connected in parallel. The first load portion 120 may be coupled to the output nodes ON1 and ON2 and the nodes A and B. The second load portion 130 may be coupled to the nodes A and B and a second voltage node which is a node where the amplification circuit 1 receives a ground voltage.

The duty cycle adjustment portion 140 may be electrically coupled to the nodes A and B, which are in between the first and second load portions 120 and 130, in parallel. The duty cycle adjustment portion 140 may be electrically coupled to the first load portion 120 and the second load portion 130 in parallel. The duty cycle adjustment portion 140 may provide correction currents IOF1 and IOF2 to the nodes A and B which are in between the first load portion 120 and the second load portion 130. The duty cycle adjustment portion 140 may be electrically coupled to the output nodes ON1 and ON2 through the first load portion 120. In other words, the duty cycle adjustment portion 140 is not directly connected to the output nodes ON1 and ON2. Therefore, even if the duty cycle adjustment portion 140 has high impedance, the configuration described above may minimize the impedance variation at the output nodes ON1 and ON2, which may be induced by the duty cycle adjustment portion 140.

Referring to FIG. 1, resistance value of the first load portion 120 may be higher than that of the second load portion 130. Basically, the impedance of the output nodes ON1 and ON2 may be determined by the resistance values of the first load portion 120 and the second load portion 130. When the resistance value of the first load portion 120 is set to be higher than the resistance value of the second load portion 130, an impedance variation at the output nodes ON1 and ON2, which may be induced by the duty cycle adjustment portion 140, may be minimized, even in the case where the duty cycle adjustment portion 140 has high impedance.

Referring to FIG. 1, the input signals IN and INB may include a first input signal IN, and a second input signal INB. The output signals OUT and OUTB may include a first output signal OUT, and a second output signal OUTB. Also, the output nodes ON1 and ON2 may include a first output node ON1 for outputting the first output signal OUT, and a second output node ON2 for outputting the second output signal OUTB. The input portion 110 may include a first transistor T1, a second transistor T2, and a third transistor T3. The first to third transistors T1 to T3 may be PMOS transistors. The input signals IN and INB may include the first input signal IN, and the second input signal INB. The first transistor T1 may receive the first input signal IN at a gate thereof. A source of the first transistor T1 may be electrically coupled to a drain of the third transistor T3. A drain of the first transistor T1 may be electrically coupled to the second output node ON2. The second transistor T2 may receive the second input signal INB at a gate thereof. A source of the second transistor T2 may be electrically coupled to the drain of the third transistor T3. A drain of the second transistor T2 may be electrically coupled to the first output node ON1. The third transistor T3 may be electrically coupled to the ground voltage at a gate thereof, coupled to a power supply voltage VDD at a source thereof, and coupled to the sources of the first and second transistors T1 and T2 at a drain thereof.

The first load portion 120 may include a first resistor R1 and a third resistor R3, and the second load portion 130 may include a second resistor R2 and a fourth resistor R4. The first resistor R1 and the third resistor R3 may have the same resistance value as each other, and the second resistor R2 and the fourth resistor R4 may have the same resistance value as each other. The first resistor R1 may be electrically coupled between the second output node ON2 and the second resistor R2, and the second resistor R2 may be electrically coupled between the first resistor R1 and a ground voltage. The third resistor R3 may be electrically coupled between the first output node ON1 and the fourth resistance R4, and the fourth resistor R4 may be electrically coupled between the third resistor R3 and the ground voltage. The duty cycle adjustment portion 140 may have electrical connections to a node A, which is a connection point of the third resistance R3 and the fourth resistor R4, and to a node B, which is a connection point of the first resistor R1 and the second resistor R2.

The amplification circuit 1 may receive differential signals, and output differential signals. For example, the second input signal INB may be a complementary signal of the first input signal IN. Similarly, the second output signal OUTB may be a complementary signal of the first output signal OUT. When the amplification circuit 1 receives the first input signal IN having a low level, and the second input signal INB having a high level, the first transistor T1 may be turned on, and the second transistor T2 may be turned off. In this situation, relatively greater amount of current may flow to the second output node ON2 than to the first output node ON1. As a result, voltage level of the second output node ON2 may be a high level, and voltage level of the first output node ON1 may be a low level. Therefore, the first output signal OUT having a low level may be generated at the first output node ON1, and the second output signal OUTB having a high level may be generated at the second output node ON2. The duty cycle adjustment portion 140 may maintain duty cycles of the first and second output signals OUT and OUTB within an allowable range by providing the correction currents IOF1 and IOF2 to the nodes A and B which are connecting nodes of the first load portion 120 and the second load portion 130. Also, the amplification circuit 1 may generate output signals OUT and OUTB which are within an allowable range by having the first load portion 120 in between the first and second output nodes ON1 and ON2 and the duty cycle adjustment portion 140. By indirectly connecting the duty cycle adjustment portion 140, influence of the duty cycle adjustment portion with respect to impedance at the first and second output nodes ON1 and ON2 may be minimized.

Figure 2:
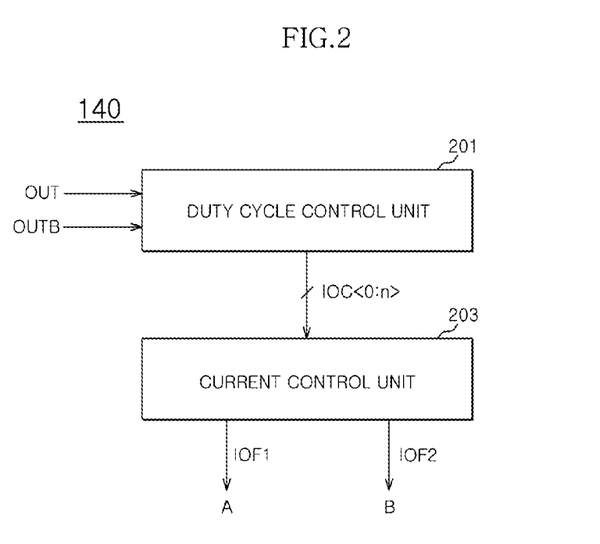
FIG. 2 is a block diagram illustrating a duty cycle adjustment portion shown in FIG. 1.

FIG. 2 is a block diagram illustrating the duty cycle adjustment portion 140 shown in FIG. 1. Referring to FIG. 2, the duty cycle adjustment portion 140 may include a duty cycle control unit 201, and a current control unit 203. The duty cycle control unit 201 may generate current offset control signals IOC<0:n>. In an embodiment of the present invention, the duty cycle control unit 201 may generate the current offset control signals IOC<0:n> in response to the output signals OUT and OUTB. The duty cycle control unit 201, which received the output signals OUT and OUTB, may detect duty cycles of the output signals OUT and OUTB and then generate the current offset control signals IOC<0:n> based on the detection result. In an embodiment of the present invention, the duty cycle control unit 201 may generate the current offset control signals IOC<0:n> without receiving the output signals OUT and OUTB. The duty cycle control unit 201 may generate the current offset control signals IOC<0:n> having various logic values using, for example, a random number generation device.

The current control unit 203 may generate the correction currents IOF1 and IOF2 in response to the current offset control signals IOC<0:n>. The current control unit 203 may include a plurality of drivers. The current control unit 203 may change the correction currents IOF1 and IOF2 in response to the current offset control signals IOC<0:n>.

Figure 3:
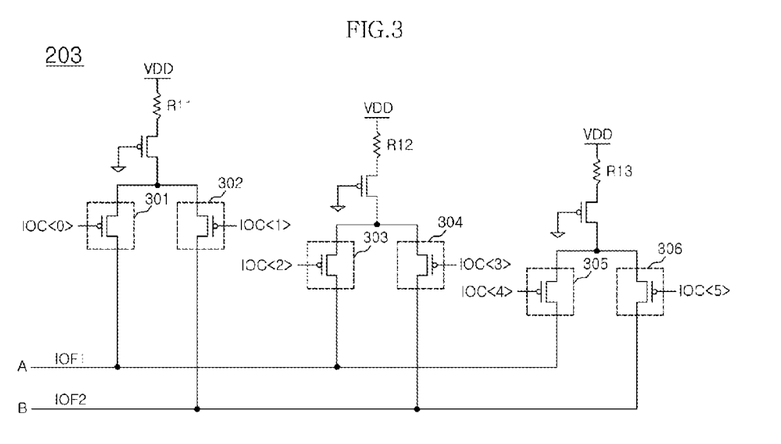
FIG. 3 is a circuit diagram illustrating a current control unit shown in FIG. 2.

FIG. 3 is a circuit diagram illustrating the current control unit 203 shown in FIG. 2. Referring to FIG. 3, the current control unit 203 may include first to sixth drivers 301 to 306, and first to third resistors R11 to R13. The first driver 301 may receive the first current offset control signal IOC<0>, the third driver 303 may receive the third current offset control signal IOC<2>, and the fifth driver 305 may receive the fifth current offset control signal IOC<4>. The first driver 301, the third driver 303, and the fifth driver 305 may be electrically coupled to the node A in common, and may provide the correction current IOF1 to the node A. The second driver 302 may receive the second current offset control signal IOC<1>, the fourth driver 304 may receive the fourth current offset control signal IOC<3>, and the sixth driver 306 may receive the sixth current offset control signal IOC<5>. The second driver 302, the fourth driver 304, and the sixth driver 306 may be electrically coupled to the node B in common, and may provide the correction current IOF2 to the node B.

The first and second drivers 301 and 302 may be electrically coupled to the first resistor R11 in common, the third and fourth drivers 303 and 304 may be electrically coupled to the second resistor R12 in common, and the fifth and sixth drivers 305 and 306 may be electrically coupled to the third resistor R13 in common. In an embodiment of the present invention, the first to third resistors R11 to R13 may have the same resistance value as each other. In an embodiment of the present invention, the second resistor R12 may have lower resistance value than the first resistor R11, and the third resistor R13 may have lower resistance value than the second resistor R12. Each of the first to third resistors R11 to R13 may be electrically coupled to a power supply voltage VDD. In this situation, the first and second drivers 301 and 302 may provide current, which smaller than that of the third to sixth drivers 303 to 306, as the correction currents IOF1 and IOF2 in response to the first and second current offset control signal IOC<0:1>, and the fifth and sixth drivers 305 and 306 may provide current, which is larger than that of the first to fourth drivers 301 to 304, as the correction currents IOF1 and IOF2 in response to the fifth and sixth current offset control signal IOC<4:5>. The current provided to each of the nodes A and B may vary depending on the first to third resistors R11 to R13 and the first to sixth drivers 301 to 306.

Figure 4:
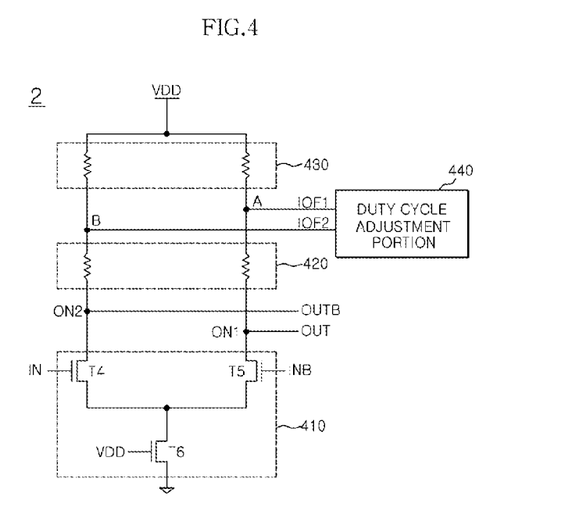
FIG. 4 is a circuit diagram illustrating an amplification circuit in accordance with an embodiment of the present invention.

FIG. 4 is a circuit diagram illustrating an amplification circuit 2 in accordance with an embodiment of the present invention. Referring to FIG. 4, the amplification circuit 2 in accordance with an embodiment of the present invention may include the input portion 410, the first load portion 420, the second load portion 430, and a duty cycle adjustment portion 440. The input portion 410 may include fourth to sixth transistors T4 to T6. The fourth transistor T4 may receive the first input signal IN at a gate thereof, and a source of the fourth transistor T4 may be electrically coupled to a drain of the sixth transistor T6. The fifth transistor T5 may receive the second input signal INB at a gate thereof, and a source of the fifth transistor T5 may be electrically coupled to the drain of the sixth transistor T6. The sixth transistor T6 may be electrically coupled to a power supply voltage VDD at a gate thereof, coupled to a ground voltage at a source thereof, and coupled to the sources of the fourth and fifth transistors T4 and T5 at a drain thereof. The fourth to sixth transistors T4 to T6 may be NMOS transistors.

Each of the first and second load portions 420 and 430 may include a plurality of resistors. For example, the first load portion may include two resistors electrically connected to a power supply voltage VDD in parallel. The second load portion 430 may include two resistors each electrically connected to each of the resistors in the first load portion 420. The first load portion 420 may be electrically coupled to the output nodes ON1 and ON2, and the second load portion 430. The second load portion 430 may be electrically coupled to the first load portion 420 through a plurality of nodes A and B. The duty cycle adjustment portion 440 electrically coupled to the first load portion 420 and the second load portion 430 through a plurality of nodes A and B and may provide correction currents IOF1 and IOF2 to the nodes A and B.

Figure 5:
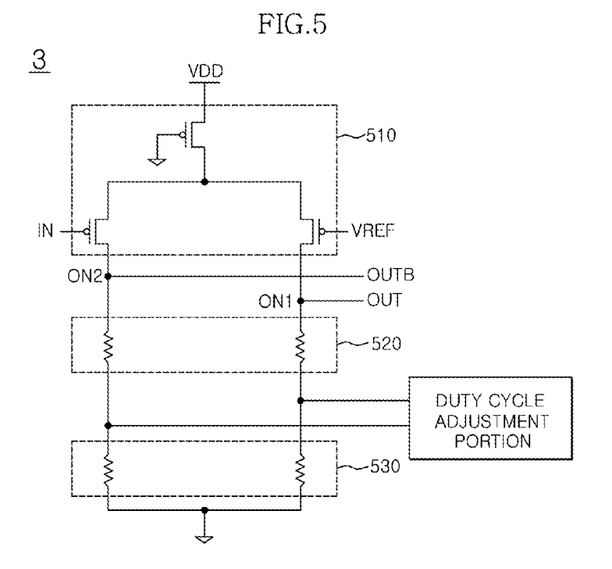
FIG. 5 is a circuit diagram illustrating an amplification circuit in accordance with an embodiment of the present invention.

FIG. 5 is a circuit diagram illustrating an amplification circuit 3 in accordance with an embodiment of the present invention. Referring to FIG. 5, the amplification circuit 3 may include the input portion 510, the first load portion 520, and the second load portion 530. Each of the first and second load portions 520 and 530 may include a plurality of resistors. For example, the second load portion 530 may include two resistors electrically connected to a ground voltage in parallel. The first load portion 530 may include two resistors each electrically connected to each of the resistors in the second load portion 520. The amplification circuit 3 may receive single ended signal, and output the differential signals. Referring to FIG. 1, the input portion 110 of the amplification circuit 1 may receive the first input signal IN and the second input signal INB, which is the differential signal of the first input signal IN. However, referring to FIG. 5, an input portion 510 of the amplification circuit 3 may receive the first input signal IN and a reference voltage VREF. The reference voltage VREF may have a voltage level between a high level and a low level. Therefore, when the first input signal IN has a low level, the voltage level of the second output node ON2 may become higher, the first output signal OUT having a low level may be generated at the first output node ON1, and the second output signal OUTB having a high level may be generated at the second output node ON2. On the other hand, when the first input signal IN has a high level, the voltage level of the first output node ON2 may become lower, the first output signal OUT having a high level may be generated at the first output node ON1, and the second output signal OUTB having a low level may be generated at the second output node ON2.

Figure 6:
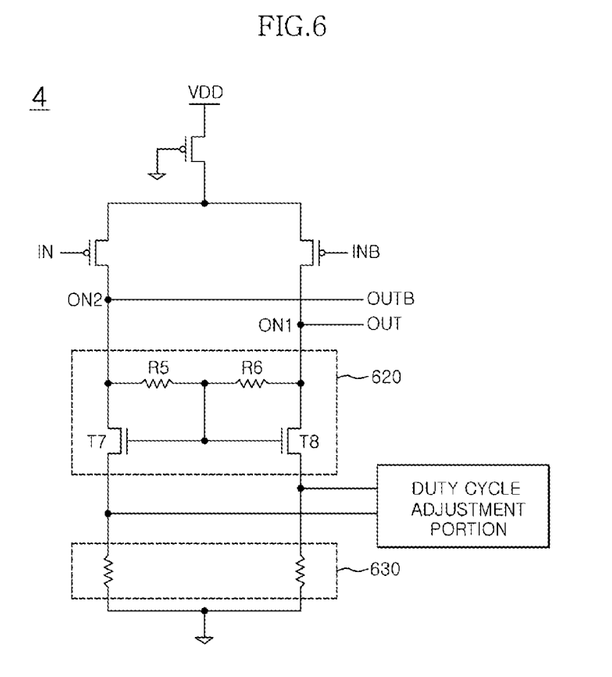
FIG. 6 is a circuit diagram illustrating an amplification circuit in accordance with an embodiment of the present invention.

FIG. 6 is a circuit diagram illustrating an amplification circuit 4 in accordance with an embodiment of the present invention. Referring to FIG. 6, the first load portion 620 may include a fifth resistor R5, a sixth resistor R6, a seventh transistor T7, and an eighth transistor T8. A first node of the fifth resistor R5 may be electrically coupled to the second output node ON2, and a drain of the seventh transistor T7. A first node of the sixth resistor R6 may be electrically coupled to the first output node ON1, and a drain of the eighth transistor T8. The gate of the seventh transistor T7, the gate of the eighth transistor T8, a second node of the fifth resistor R5, and a second node of the sixth resistor R6 may be electrically coupled to each other in common. Sources of the seventh and eighth transistors T7 and T8 may be electrically coupled to the resistors of a second load portion 630, respectively.

Figure 7:
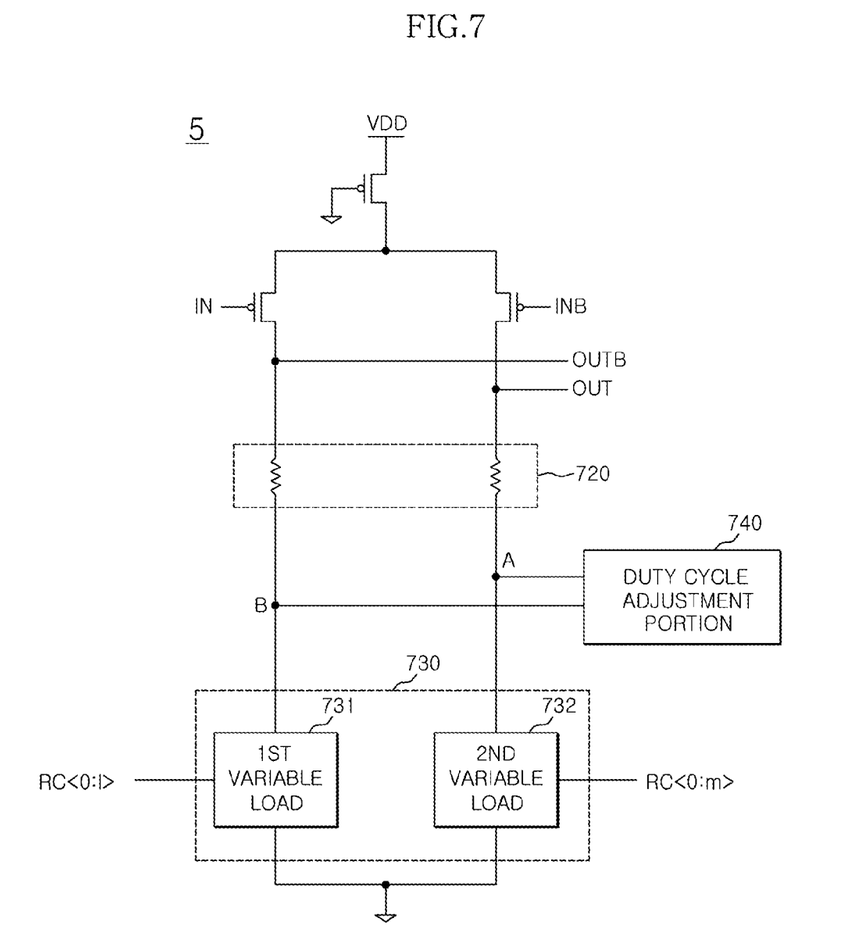
FIG. 7 is a circuit diagram illustrating an amplification circuit in accordance with an embodiment of the present invention.

FIG. 7 is a circuit diagram illustrating an amplification circuit 5 in accordance with an embodiment of the present invention. Referring to FIG. 7, the second load portion 730 may include a first variable load 731, and a second variable load 732. The first variable load 731 may be electrically coupled to a first load portion 720 and a duty cycle adjustment portion 740 through the node B. The second variable load 732 may be electrically coupled to the first load portion 720 and the duty cycle adjustment portion 740 through the node A. The first and second variable loads 731 and 732 may be electrically coupled to a ground voltage in common. The first variable load 731 may receive a first variable resistance code RC<0:l> (l is a natural number), and may have a variable resistance value varying in response to the first variable resistance code RC<0:l>. The second variable load 732 may receive a second variable resistance code RC<0:m> (m is a natural number), and may have a variable resistance value varying in response to the second variable resistance code RC<0:m>. In an embodiment of the present invention, the first and second variable resistance codes RC<0:l> and RC<0:m> may be generated on the basis of detection result of duty cycles of the output signals OUT and OUTB. In an embodiment of the present invention, the first and second variable resistance codes RC<0:l> and RC<0:m> may be inputted from an external controller, or may be implemented by a test mode signal. Although not illustrated in FIG. 7, the first variable load 731 and the second variable load 732 may include a resistor having a unit resistance, and may include a plurality of resistance legs, which may be turned on in response to each of the first and second variable resistance codes RC<0:l> and RC<0:m>. The amplification circuit 5 may adjust the duty cycles of the output signals OUT and OUTB by changing the amount of current flowing to the nodes A and B through the duty cycle adjustment portion 740, and changing resistance values of the first and second variable loads 731 and 732.

Figure 8:
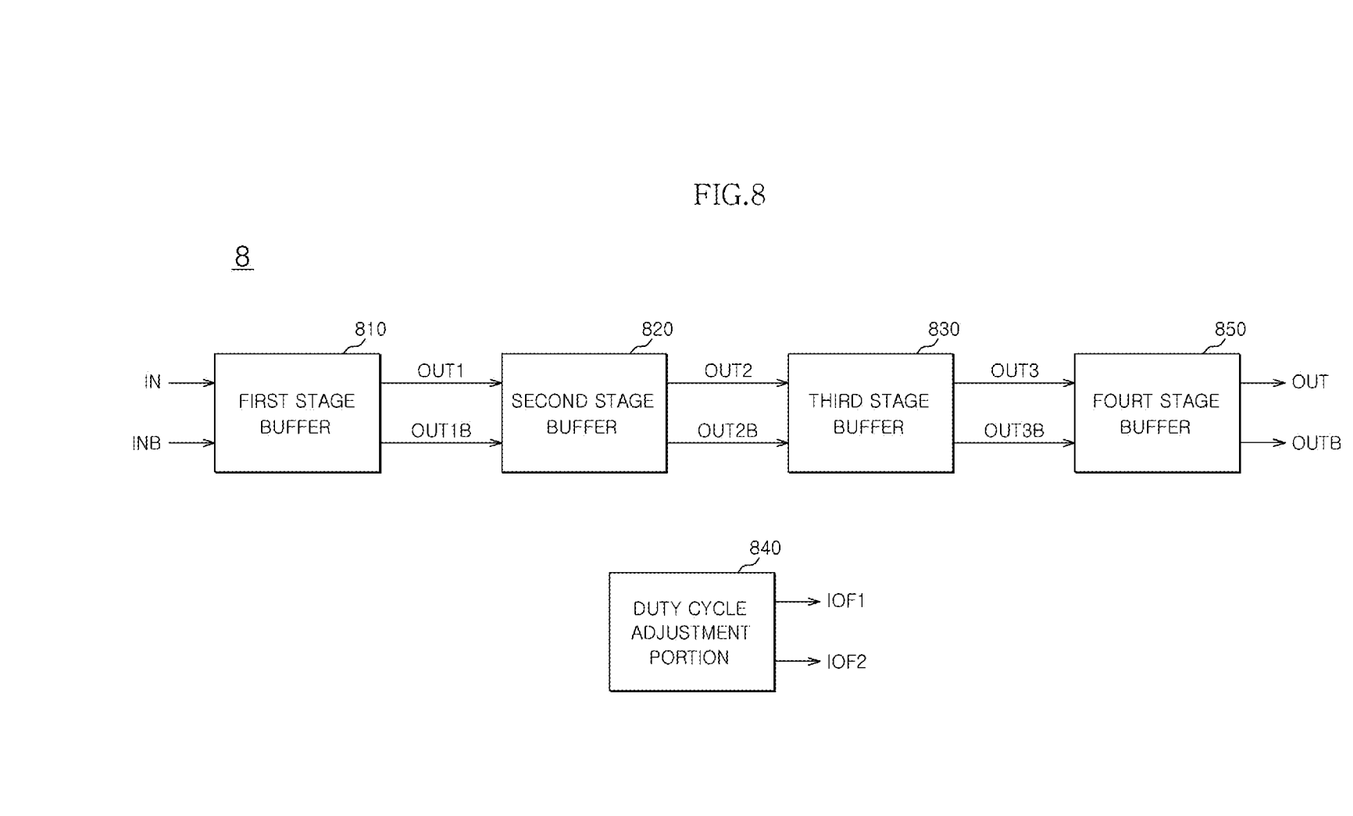
FIG. 8 is a circuit diagram illustrating a receiver in accordance with an embodiment of the present invention.

FIG. 8 is a circuit diagram illustrating a receiver 8 in accordance with an embodiment. Referring to FIG. 8, the receiver 8 may include a first stage buffer 810, a second stage buffer 820, and a third stage buffer 830. The first stage buffer 810 may receive input signals IN and INB and generate output signals OUT1 and OUT1B by amplifying the input signals IN and INB. The second stage buffer 820 may receive the output signals OUT1 and OUT1B of the first stage buffer 810 and generate output signals OUT2 and OUT2B by amplifying the output signals OUT1 and OUT1B of the first stage buffer 810. The third stage buffer 830 may receive the output signals OUT2 and OUT2B of the second stage buffer 820 and generate output signals OUT3 and OUT3B by amplifying the output signals OUT2 and OUT2B of the second stage buffer 820. The receiver 8 may perform a stage-by-stage amplification operation. As a system operates faster and consumes smaller power, amplitude of a signal transferred between semiconductor devices included in the system becomes smaller. The receiver 8 may generate a final output signals OUT and OUTB fully swinging between the power voltage and the ground voltage by amplifying step by step the input signals IN and INB having a small amplitude. Therefore, the receiver 8 may generate the final output signals OUT and OUTB precisely corresponding to the input signals IN and INB.

In accordance with an embodiment, the first stage buffer 810 may have a first common mode voltage, the second stage buffer 820 may have a second common mode voltage, and the third stage buffer 830 may have a third common mode voltage. A level of the second common mode voltage may be higher than a level of the third common mode voltage, and the level of the third common mode voltage may be higher than a level of the first common mode voltage. The level of the third common mode voltage may be the middle of the power voltage and the ground voltage. In accordance with an embodiment, the first stage buffer 810 may include a P-type amplifier. The P-type amplifier may have a PMOS transistor for receiving an input signal. The second stage buffer 820 may include a P-type amplifier. The third stage buffer 830 may include an N-type amplifier. The N-type amplifier may have a NMOS transistor for receiving an input signal. Each of the first and second stage buffers 810 and 820 may preferably have the P-type amplifiers since the first and second stage buffers 810 and 820 may amplify a signal of a relatively lower level and relatively smaller amplitude. The third stage buffer 830 may preferably have the N-type amplifiers since the third stage buffer 830 may generate the final output signals OUT and OUTB fully swinging between the power voltage and the ground voltage.

Referring to FIG. 8, the receiver 8 may further include a duty cycle adjustment portion 840. The duty cycle adjustment portion 840 may be couple to one or more of the first to third stage buffers 810 to 830. The duty cycle adjustment portion 840 may provide correction currents IOF1 and IOF2 to the coupled stage buffer. The connection relationship between the duty cycle adjustment portion 840 and the first to third stage buffers 810 to 830 will be described later. The receiver 8 may further include a slicer 850. The slicer 850 may generate the final output signals OUT and OUTB by buffering the output signals OUT3 and OUT3B of the third stage buffer 830.

Figure 9:
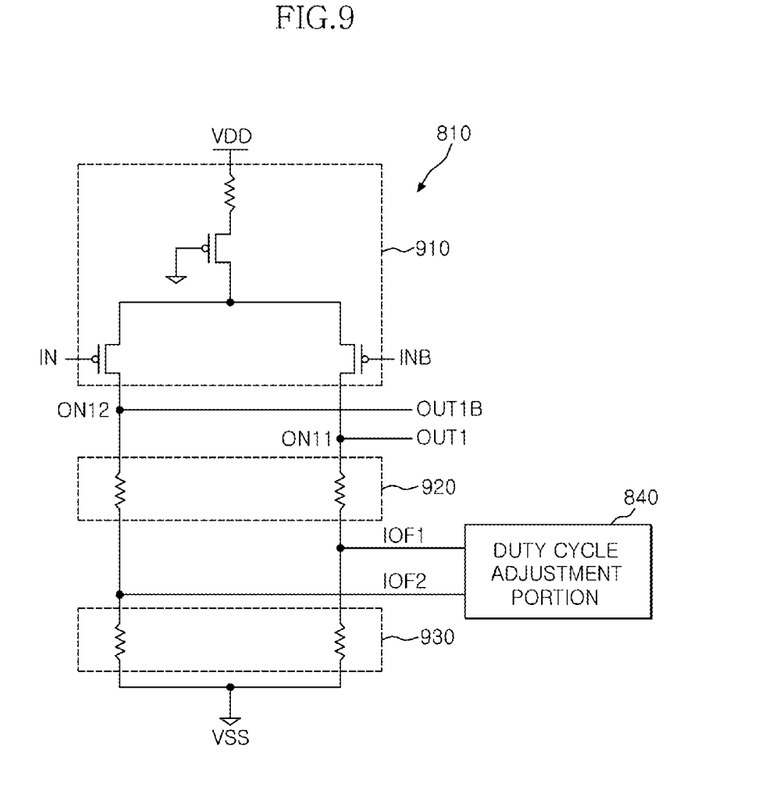
FIG. 9 is a circuit diagram illustrating a first stage buffer shown in FIG. 8.

FIG. 9 is a circuit diagram illustrating the first stage buffer 810 shown in FIG. 8, and a connection relationship between the duty cycle adjustment portion 840 and the first stage buffer 810 when the duty cycle adjustment portion 840 is electrically coupled to the first stage buffer 810. Referring to FIG. 9, the first stage buffer 810 may include the P-type amplifier. The first stage buffer 810 may include an input portion 910, a first load portion 920, and a second load portion 930. The first stage buffer 810 may have the same configuration as the amplification circuit 1 of FIG. 1. The input portion 910 may receive the input signals IN and INB, and change voltage levels of output nodes ON11 and ON12 based on the input signals IN and INB. The output signals OUT1 and OUT1B of the first stage buffer 810 may be generated at the output nodes ON11 and ON12. The input portion 910 may be electrically coupled between a first voltage node and the output nodes ON11 and ON12. The first voltage node may be electrically coupled to a power voltage VDD. The input portion 910 may further include a resistance for adjusting currents provided to the output nodes ON11 and ON12 when compared with the input portion 110 of FIG. 1. The first load portion 920 may be electrically coupled between the output nodes ON11 and ON12 and the second load portion 930, and the second load portion 930 may be electrically coupled between the first load portion 920 and a second voltage node. The second voltage node may be electrically coupled to a ground voltage VSS.

The duty cycle adjustment portion 840 may be electrically coupled between the first load portion 920 and the second load portion 930. The duty cycle adjustment portion 840 may be indirectly coupled to the output nodes ON11 and ON12 through the first load portion 920. The duty cycle adjustment portion 840 may provide the correction currents IOF1 and IOF2 to the output nodes ON11 and ON12 through the first load portion 920.

Figure 10:
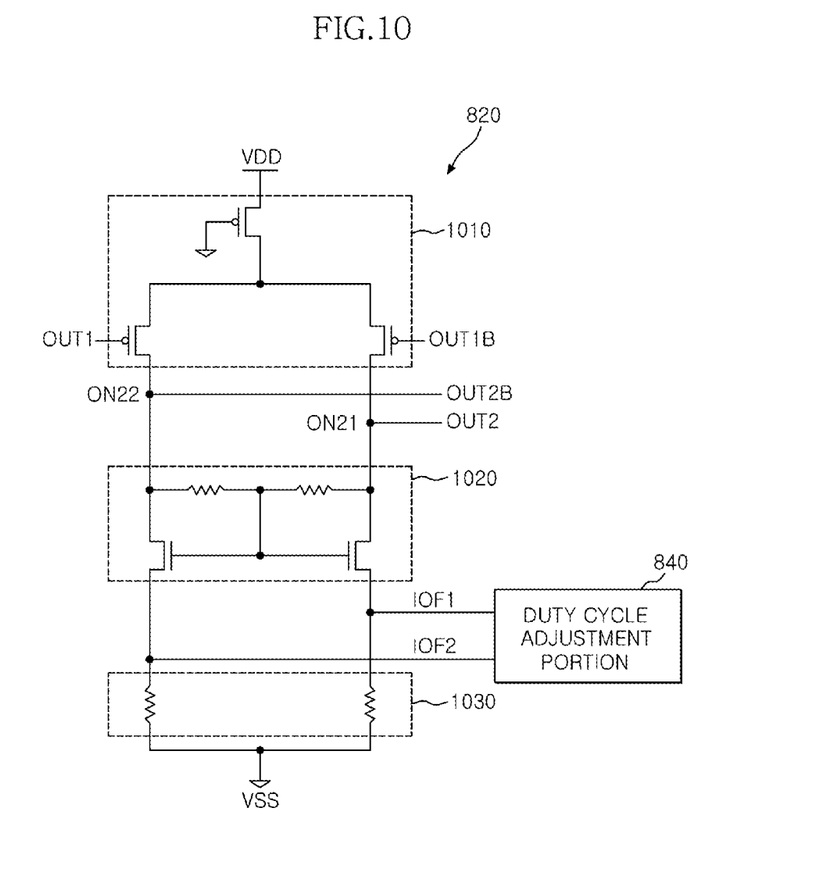
FIG. 10 is a circuit diagram illustrating a second stage buffer shown in FIG. 8.

FIG. 10 is a circuit diagram illustrating the second stage buffer 820 shown in FIG. 8, and a connection relationship between the duty cycle adjustment portion 840 and the second stage buffer 820 when the duty cycle adjustment portion 840 is electrically coupled to the second stage buffer 820. Referring to FIG. 10, the second stage buffer 820 may include the P-type amplifier. The second stage buffer 820 may include an input portion 1010, a first load portion 1020, and a second load portion 1030. The second stage buffer 820 may have the same configuration as the amplification circuit 4 of FIG. 6. The input portion 1010 may receive the output signals OUT1 and OUT1B of the first stage buffer 810, and change voltage levels of output nodes ON21 and ON22 based on the output signals OUT1 and OUT1B of the first stage buffer 810. The output signals OUT2 and OUT2B of the second stage buffer 820 may be generated at the output nodes ON21 and ON22. The input portion 1010 may be electrically coupled between a first voltage node and the first load portion 1020. The first voltage node may be electrically coupled to a power voltage VDD. The second load portion 1030 may be electrically coupled between the first load portion 1020 and a second voltage node. The second voltage node may be electrically coupled to a ground voltage VSS.

The duty cycle adjustment portion 840 may be electrically coupled between the first load portion 1020 and the second load portion 1030. The duty cycle adjustment portion 840 may be indirectly coupled to the output nodes ON21 and ON22 through the first load portion 1020. The duty cycle adjustment portion 840 may provide the correction currents IOF1 and IOF2 to the output nodes ON21 and ON22 through the first load portion 1020.

Figure 11:
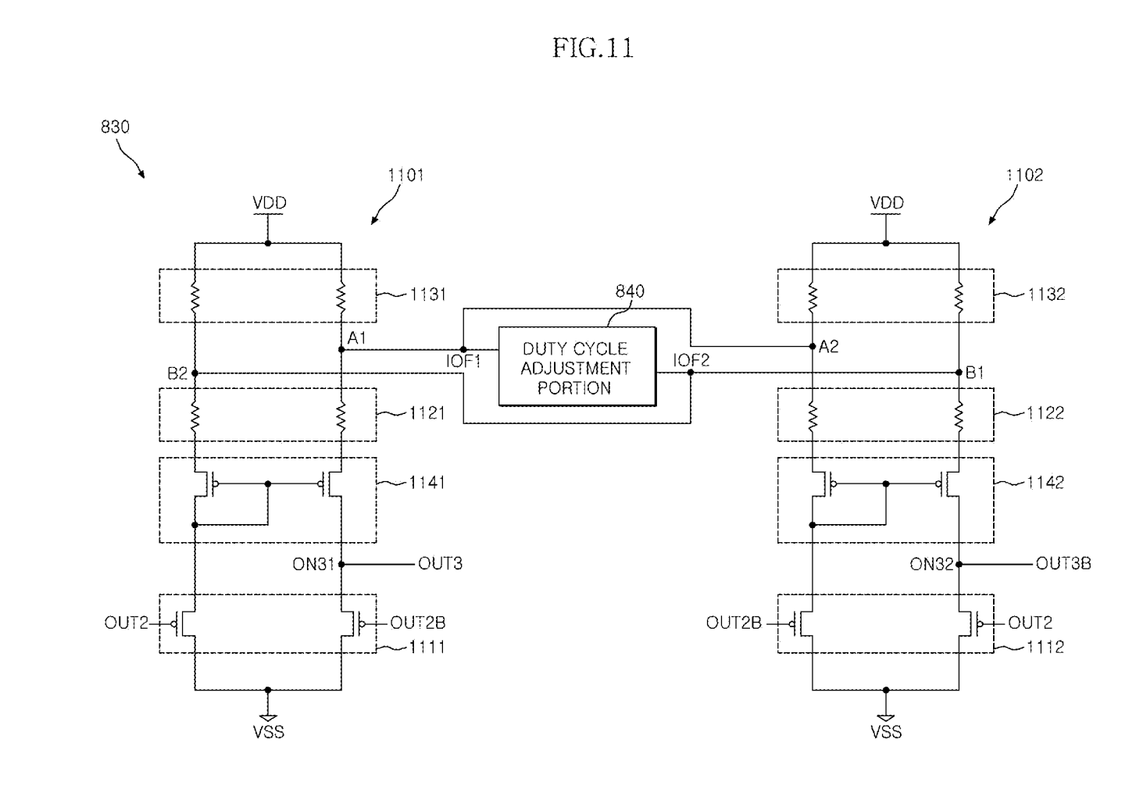
FIG. 11 is a circuit diagram illustrating a third stage buffer shown in FIG. 8.

FIG. 11 is a circuit diagram illustrating the third stage buffer 830 shown in FIG. 8, and a connection relationship between the duty cycle adjustment portion 840 and the third stage buffer 830 when the duty cycle adjustment portion 840 is electrically coupled to the third stage buffer 830. Referring to FIG. 11, the third stage buffer 830 may receive the output signals OUT2 and OUT2B of the second stage buffer 820, and generate the output signals OUT3 and OUT3B of the third stage buffer 830. The third stage buffer 830 may include a first amplifier 1101 and a second amplifier 1102. Each of the first and second amplifiers 1101 and 1102 may be the N-type amplifier. The first amplifier 1101 may receive the output signals OUT2 and OUT2B of the second stage buffer 820 and generate a first output signal OUT3 of the output signals OUT3 and OUT3B, and the second amplifier 1102 may receive the output signals OUT2 and OUT2B of the second stage buffer 820 and generate a second output signal OUT3B of the output signals OUT3 and OUT3B.

The first amplifier 1101 may include a first input portion 1111, a first load portion 1121, a second load portion 1131 and a first current mirror 1141. The first input portion 1111 may receive the output signals OUT2 and OUT2B of the second stage buffer 820, and generate the first output signal OUT3 based on the output signals OUT2 and OUT2B of the second stage buffer 820. The first input portion 1111 may include a NMOS transistor for receiving the output signals OUT2 and OUT2B of the second stage buffer 820. The first input portion 1111 may be electrically coupled between the first current mirror 1141 and a second voltage node. The second voltage node may be electrically coupled to a ground voltage VSS. The first load portion 1121 may be electrically coupled between the first current mirror 1141 and the second load portion 1131. The second load portion 1131 may be electrically coupled between a first voltage node and the first load portion 1121. The first voltage node may be electrically coupled to a power voltage VDD. The first current mirror 1141 may provide an amplified current to the first input portion 1111. The first output signal OUT3 may be generated at a first output node ON31 between the first current mirror 1141 and the first input portion 1111.

The second amplifier 1102 may include a second input portion 1112, a third load portion 1122, a fourth load portion 1132 and a second current mirror 1142. The second input portion 1112 may receive the output signals OUT2 and OUT2B of the second stage buffer 820, and generate the second output signal OUT3B based on the output signals OUT2 and OUT2B of the second stage buffer 820. The second input portion 1112 may include a NMOS transistor for receiving the output signals OUT2 and OUT2B of the second stage buffer 820. The second input portion 1112 may be electrically coupled between the second current mirror 1142 and the second voltage node. The third load portion 1122 may be electrically coupled between the second current mirror 1142 and the fourth load portion 1132. The fourth load portion 1132 may be electrically coupled between the first voltage node and the third load portion 1122. The second current mirror 1142 may provide an amplified current to the second input portion 1112. The second output signal OUT3B may be generated at a second output node ON32 between the second current mirror 1142 and the second input portion 1112.

The first load portion 1121 and the third load portion 1122 may have substantially the same resistance value. The second load portion 1131 and the fourth load portion 1132 may have substantially the same resistance value. The resistance value of the respective first and third load portions 1121 and 1122 may be greater than the resistance value of the respective second and fourth load portions 1131 and 1132. The resistance value of the respective second and fourth load portions 1131 and 1132 may be variable according to a variable resistance code.

The duty cycle adjustment portion 840 may be commonly coupled to the first and second amplifiers 1101 and 1102. The duty cycle adjustment portion 840 may be electrically coupled to a node A1 between the first and second load portions 1121 and 1131 and to a node B1 between the third and fourth load portions 1122 and 1132. The duty cycle adjustment portion 840 may provide the correction currents IOF1 and IOF2 to the nodes A1 and B1. Also, the duty cycle adjustment portion 840 may be electrically coupled to another node B2 between the first and second load portions 1121 and 1131 and to another node A2 between the third and fourth load portions 1122 and 1132. The nodes A1 and A2 may be electrically coupled to each other, and the nodes B1 and B2 may be electrically coupled to each other. The duty cycle adjustment portion 840 may be indirectly coupled to the output nodes ON31 and ON32 through the first load portion 1121 and the third load portion 1131. The duty cycle adjustment portion 840 may provide the correction currents IOF1 and IOF2 to the output nodes ON31 and ON32 through the first load portion 1121 and the third load portion 1131.

Figure 12:
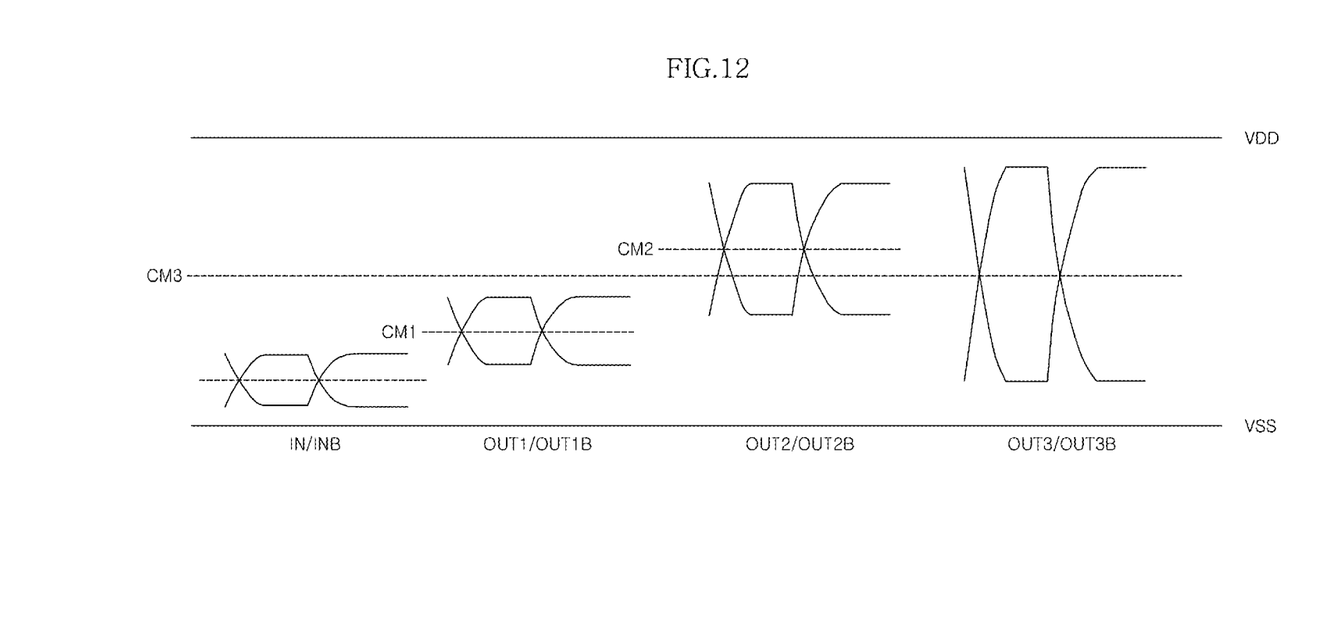
FIG. 12 is a signal diagram illustrating an operation of the receiver in accordance with an embodiment of the present invention.

FIG. 12 is a signal diagram illustrating an operation of the receiver 8 in accordance with an embodiment of the present invention. The operation of the receiver 8 will be described as follows with reference to FIGS. 8 to 12. The first stage buffer 810 may have the first common mode voltage CM1, and generate the output signals OUT1 and OUT1B by amplifying the input signals IN and INB. The input signals IN and INB may swing around the ground voltage VSS with a little amplitude. The first stage buffer 810 may precisely amplify the input signals IN and INB since the first stage buffer 810 includes the P-type amplifier. The output signals OUT1 and OUT1B of the first stage buffer 810 may swing with reference to the first common mode voltage CM1, and may be amplified by the first stage buffer 810 to have greater amplitude than those of the input signals IN and INB. The second stage buffer 820 may have the second common mode voltage CM2, and generate the output signals OUT2 and OUT2B by amplifying the output signals OUT1 and OUT1B of the first stage buffer 810. The second stage buffer 820 may precisely amplify the output signals OUT1 and OUT1B of the first stage buffer 810 since the second stage buffer 820 includes the P-type amplifier. The output signals OUT2 and OUT2B of the second stage buffer 820 may swing with reference to the second common mode voltage CM2, and may be amplified by the second stage buffer 820 to have greater amplitude than those of the output signals OUT1 and OUT1B of the first stage buffer 810.

Also, the third stage buffer 830 may have the third common mode voltage CM3, and generate the output signals OUT3 and OUT3B by amplifying the output signals OUT2 and OUT2B of the second stage buffer 820. The second common mode voltage CM2 has a higher level than the third common mode voltage CM3, and thus the output signals OUT2 and OUT2B of the second stage buffer 820 may swing around the power voltage VDD. The third stage buffer 830 may precisely amplify the output signals OUT2 and OUT2B of the second stage buffer 820 since the third stage buffer 830 includes the N-type amplifier. The output signals OUT3 and OUT3B of the third stage buffer 830 may swing with reference to the third common mode voltage CM3, and may be amplified by the third stage buffer 830 to have greater amplitude than those of the input signals IN and INB. Also, since the output signals OUT2 and OUT2B of the second stage buffer 820 have the amplitudes amplified in step by step through the first and second stage buffer 810 and 820, the third stage buffer 830 may generate the output signals OUT3 and OUT3B fully swinging between the power voltage VDD and the ground voltage VSS with reference to the third common mode voltage CM3.

Figure 13:
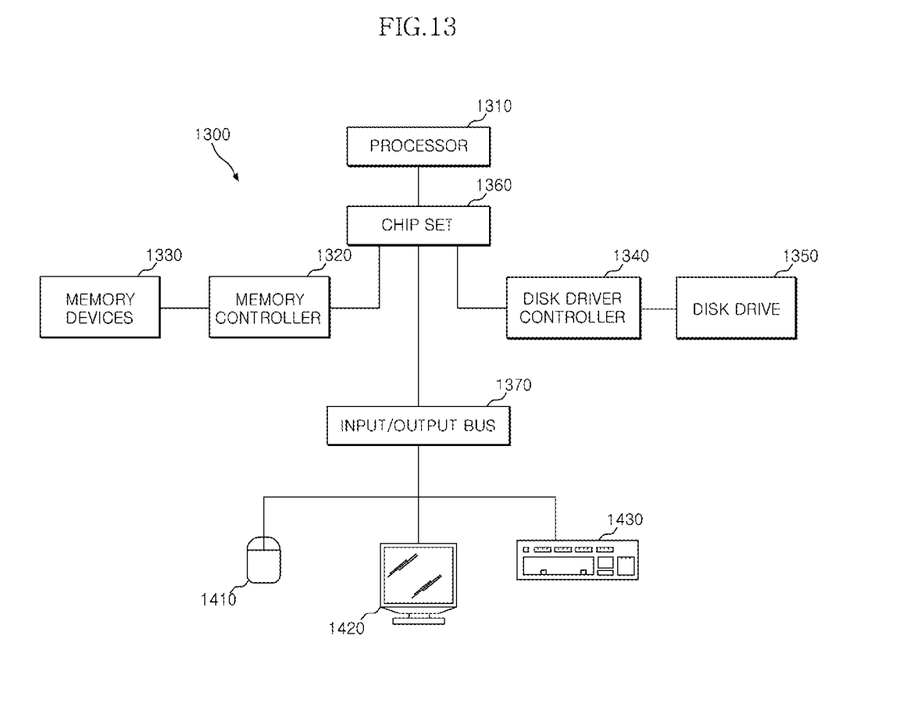
FIG. 13 is a schematic block diagram illustrating a system in accordance with an embodiment of the present invention.

FIG. 13 is a schematic block diagram illustrating a system 1300 in accordance with an embodiment of the present invention. Referring to FIG. 13, the system 1300 may include a processor 1310, a memory controller 1320, and memory devices 1330. The processor 1310 may be electrically coupled to the memory controller 1320 through a chip set 1360, and the memory controller 1320 may be electrically coupled to the memory devices 1330 through a plurality of buses. FIG. 13 shows a single processor 1310 as an example. However the present invention is not limited to the single processor 1310, and the system 1300 in accordance with an embodiment of the present invention may include a plurality of physical or logical processors. The chip set 1360 may provide communication path for signal transfer between the processor 1310 and the memory controller 1320. The processor 1310 may perform an arithmetic operation, and transmit request and/or data to the memory controller 1320 through the chip set 1360 in order to input and output data.

The memory controller 1320 may transmit command signal, address signal, clock signal, and data through the plurality of buses. The memory devices 1330 may receive the signals from the memory controller 1320, store data, and output the stored data to the memory controller 1320. The memory devices 1330 may include a volatile memory device such as a dynamic random access memory (DRAM) or a nonvolatile memory device such as a flash memory, a phase change random access memory (PCRAM), a resistive random access memory (ReRAM), a ferroelectric random access memory (FeRAM), a magnetic random access memory (MRAM) and a Spin Transfer Torque random access memory (STTRAM). Also, the memory devices 1330 may comprise a combination of two or more of the volatile memory device and the nonvolatile memory device.

Between the processor 1310 and the memory controller 1320, the processor 1310 may be a master device, and the memory controller 1320 may be a slave device. Each of the processor 1310 and the memory controller 1320 may include a reception circuit for receiving a signal transmitted from the other device since the processor 1310 and the memory controller 1320 may transmit and receive request and data to and from each other. The reception circuit may include the amplification circuits 1 to 4 or the receiver 8 described above with reference to FIGS. 1 to 11.

Between the memory controller 1320 and the memory devices 1330, the memory controller 1320 may be a master device, and the memory devices 1330 may be a slave device. Each of the memory controller 1320 and the memory devices 1330 may include a reception circuit for receiving a signal transmitted from the other device since the memory controller 1320 may transmit command signal, address signal, clock signal, and data to the memory devices 1330, and the memory devices 1330 may transmit data to the memory controller 1320. The reception circuit may include the amplification circuits 1 to 4 or the receiver 8 described above with reference to FIGS. 1 to 11.

Referring to FIG. 13, the system 1300 may further include an input/output bus 1370, input/output devices 1410, 1420, and 1430, a disk driver controller 1340, and a disk drive 1350. The chip set 1360 may be electrically coupled to the input/output bus 1370. The input/output bus 1370 may provide communication path for signal transfer from the chip set 1360 to the input/output devices 1410, 1420, and 1430. The input/output devices 1410, 1420, and 1430 may include a mouse 1410, a video display 1420, or a keyboard 1430. The input/output bus 1370 may include any protocol capable of communicating with the input/output devices 1410, 1420, and 1430. Also, the input/output bus 1370 may be integrated inside the chip set 1360.

The disk driver controller 1340 may perform operation while being connected to the chip set 1360. The disk driver controller 1340 may provide communication path for signal transfer between the chip set 1360 and one or more of the disk drives 1350. The disk drive 1350 may serve as an external data storage device by storing commands and data. The disk driver controller 1340 and the disk drive 1350 may communicate with each other or with the chip set 1360 using any protocol including the input/output bus 1370.

While certain embodiments have been described above, it will be understood to those skilled in the art that the embodiments described are by way of example only. Accordingly, the amplification circuit capable of buffering or amplifying an input signal and the receiver including the same should not be limited based on the described embodiments. Rather, the amplification circuit capable of buffering or amplifying an input signal and the receiver including the same described herein should only be limited in light of the claims that follow when taken in conjunction with the above description and accompanying drawings.

What is claimed is:

1. A receiver comprising:
a first stage buffer configured to amplify an input signal;
a second stage buffer configured to amplify an output signal of the first stage buffer; and
a third stage buffer configured to amplify an output signal of the second stage buffer,
wherein the first stage buffer includes:
an input portion electrically coupled to a first voltage node, and configured to change a voltage level of an output node in response to the input signal;
first and second load portions electrically coupled between a second voltage node and the output node, and electrically coupled to each other; and
a duty cycle adjustment portion electrically coupled between the first and second load portions, and configured to provide a correction current to the output node through the first load portion.

2. The receiver of claim 1,
wherein one node of the first load portion is electrically coupled to the output node, and the other node of the first load portion is electrically coupled to one node of the second load portion, and the other node of the second load portion is electrically coupled to the second voltage node.

3. The receiver of claim 1, wherein a resistance value of the first load portion is greater than a resistance value of the second load portion.

4. The receiver of claim 1, wherein the second load portion has a resistance value variable according to a variable resistance code.

5. The receiver of claim 1,
wherein each of the first stage buffer and the second stage buffer includes a P-type amplifier, and the third stage buffer includes a N-type amplifier.

6. The receiver of claim 1, wherein the second stage buffer has a higher common mode voltage than a common mode voltage of each of the first and third stage buffers.

7. A receiver comprising:
a first stage buffer configured to amplify an input signal;
a second stage buffer configured to amplify an output signal of the first stage buffer; and
a third stage buffer configured to amplify an output signal of the second stage buffer,
wherein the second stage buffer includes:
an input portion electrically coupled to a first voltage node, and configured to change voltage levels of output nodes in response to the output signal of the first stage buffer;
first and second load portions electrically coupled between a second voltage node and the output nodes, and electrically coupled to each other; and
a duty cycle adjustment portion electrically coupled between the first and second load portions, and configured to provide correction currents to the output nodes through the first load portion.

8. The receiver of claim 7, wherein a resistance value of the first load portion is greater than a resistance value of the second load portion.

9. The receiver of claim 7,
wherein the output nodes include a first output node and a second output node,
wherein the first load portion includes:
a first resistance having one end electrically coupled to the first output node;
a second resistance having one end electrically coupled to the second output node, and the other end electrically coupled to the other end of the first resistance;
a first transistor having a gate electrically coupled to the other ends of the first and second resistances, a drain electrically coupled to the one end of the first resistance, and a source electrically coupled to the second load portion; and
a second transistor having a gate electrically coupled to the other ends of the first and second resistances, a drain electrically coupled to the one end of the second resistance, and a source electrically coupled to the second load portion.

10. The receiver of claim 7, wherein the second load portion has a resistance value variable according to a variable resistance code.

11. The receiver of claim 7,
wherein each of the first stage buffer and the second stage buffer includes a P-type amplifier, and
wherein the third stage buffer includes a N-type amplifier.

12. The receiver of claim 7, wherein the second stage buffer has a higher common mode voltage than a common mode voltage of each of the first and third stage buffers.

13. A receiver comprising:
a first stage buffer configured to amplify an input signal;
a second stage buffer configured to amplify an output signal of the first stage buffer; and
a third stage buffer configured to amplify an output signal of the second stage buffer,
wherein the third stage buffer includes:
a first amplifier having:
a first input portion electrically coupled to a second voltage node, and configured to generate a first output in response to the output signal of the second stage buffer;
a first current mirror configured to provide an amplified current to the first input portion; and
first and second load portions serially coupled between a first voltage node and the first current mirror;
a second amplifier having:
a second input portion electrically coupled to a second voltage node, and configured to generate a second output in response to the output signal of the second stage buffer;
a second current mirror configured to provide an amplified current to the second input portion; and third and fourth load portions serially coupled between the first voltage node and the second current mirror; and a duty cycle adjustment portion electrically coupled between the first and second load portions and the third and fourth load portions.

14. The receiver of claim 13,
wherein the first load portion having one end electrically coupled between the first current mirror and the second load portion,
wherein the second load portion electrically coupled between the first load portion and the first voltage node,
wherein the third load portion having electrically coupled between the second current mirror and the fourth load portion, and
wherein the fourth load portion electrically coupled between the third load portion and the first voltage node.

15. The receiver of claim 13,
wherein a resistance value of the first load portion is greater than a resistance value of the second load portion, and
wherein a resistance value of the third load portion is greater than a resistance value of the fourth load portion.

16. The receiver of claim 13, wherein each of the second and fourth load portions has a resistance value variable according to a variable resistance code.

17. The receiver of claim 13,
wherein each of the first stage buffer and the second stage buffer includes a P-type amplifier, and
wherein each of the first and second amplifiers is a N-type amplifier.

18. The receiver of claim 13, wherein the second stage buffer has a higher common mode voltage than a common mode voltage of each of the first and third stage buffers.

* * * * *